(12) United States Patent
Chroneos, Jr. et al.

(10) Patent No.: US 6,259,039 B1
(45) Date of Patent: Jul. 10, 2001

(54) SURFACE MOUNT CONNECTOR WITH PINS IN VIAS

(75) Inventors: Robert J. Chroneos, Jr., Tempe; Hamid Ekhlassi, Chandler, both of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/222,604

(22) Filed: Dec. 29, 1998

(51) Int. Cl.$^7$ ....................................................... H01R 9/09
(52) U.S. Cl. ............................. 174/263; 174/260; 439/83; 361/791; 361/768
(58) Field of Search ..................... 174/262, 263, 174/264, 266; 361/772, 773, 774, 783, 791, 768; 439/83, 876

(56) References Cited

U.S. PATENT DOCUMENTS

| | | | |
|---|---|---|---|
| 5,006,922 | * 4/1991 | McShane et al. | ..................... 257/697 |
| 5,497,545 | * 3/1996 | Watanabe et al. | ....................... 29/830 |
| 5,535,101 | * 7/1996 | Miles et al. | ............................ 367/808 |
| 5,539,186 | * 7/1996 | Abrami et al. | ......................... 219/548 |
| 5,656,798 | * 8/1997 | Kubo et al. | ............................ 174/265 |
| 5,669,783 | * 9/1997 | Inoue et al. | ............................ 439/331 |
| 5,890,284 | * 4/1999 | Chartrand et al. | ...................... 29/853 |
| 6,002,172 | * 12/1999 | Desai et al. | ............................ 257/737 |
| 6,037,044 | * 3/2000 | Giri et al. | ............................. 428/209 |
| 6,080,936 | * 6/2000 | Yamasaki et al. | .................... 174/263 |

\* cited by examiner

*Primary Examiner*—Jeffrey Gaffin
*Assistant Examiner*—Kamand Cuneo
(74) *Attorney, Agent, or Firm*—Schwegman, Lundberg, Woessner & Kluth, P.A.

(57) ABSTRACT

A surface mountable pin connector has a substrate or a circuit board carrier, which has a number of through holes or vias formed therein, and a number of connector pins, each of which is soldered into a respective one of the through holes with high melt temperature solder. A damming device or protrusion is located on each pin nearer to the shoulder than typical interference fit protrusions. The damming device is sized and shaped to completely block the through hole or via.

17 Claims, 3 Drawing Sheets

SURFACE MOUNT CONNECTOR WITH PINS IN VIAS

FIELD

The present invention relates generally to the field of mounting electronic computer components, and more specifically to surface mounting of connectors and circuit boards.

BACKGROUND

Conventional surface mount processing materials, equipment, and methods are incapable of adequately providing a reliable high density surface mountable pin grid array connector. Presently, surface mount technology includes mounting substrates or circuit board carriers by using a small volume of solder paste or flux to solder connector pins directly to the cartridge substrate using conventional stencil printing. This limited solder volume may not be enough to overcome coplanarity or flatness problems with the pin heads or the substrate. Substrates may be warped, or pin heads may not be uniform, or may not be placed properly. This can lead to inconsistencies in the mounting process, which given the stress applied to many circuit boards in the course of their lifetime, may weaken and even break joints, leading to failure of the board, and to potential costly problems with other equipment relying on the board.

The limited solder volume of the present technology leads to a board connection which has a tendency to not be able to overcome the flatness, or coplanarity, variations in connector pin heads or of the substrate to which the connector pins are being attached. Also, the limited solder volume leads to an increased likelihood of mechanical failure of joints in an application environment.

Further, misregistration and placement inaccuracy of components onto a surface mount assembly with low solder volume may cause more problems. More specifically, reflow of a small volume of solder may lead to problems with placement accuracy of a surface mount assembly with respect to the connector. Variations in pin heads and warpage of the substrate of the connector decrease tolerance to any inconsistencies and differences between parts. This can lead to decreased yield and manufacturability of connectors or circuit board carriers. Problems may occur in centering a connector or other board to be soldered to a surface mount assembly due to misregistration or placement inaccuracies. Reflowing a small amount of solder may allow for further buildup of errors.

An additional problem with conventional surface mount technology is reflowing to perform a surface mount connection. During reflow of the low solder volume board, the board solder, used for attaching the circuit board carrier to a surface mount assembly, is melted. The solder holding pins into the carrier also tends to melt, leading to wicking of hole solder over the surface of the pins by capillary action. This melting and wicking of the pin attachment solder can lead to weakening of the joint by further depleting the solder volume of the connector, as well as to an increased effect of variations in flatness of the pin heads or the substrate.

Current connector pins often use an interference type fit structure on the pin. This interference type fit structure may take many forms, such as barbs or other protrusions from the pin which are designed to allow the pin to be press fit into a through hole or via in a circuit board or the like, to be held temporarily until the pins can be soldered into the through hole or via. Such interference fit pins do not deter wicking of the hole solder over the surface of the pin. Depletion of the solder in the hole has been described above. The wicking can even allow solder to flow over and around a shoulder situated on the pin and positioned at the end of a hole.

SUMMARY

A surface mountable pin connector with a substrate or a circuit board carrier having a number of through holes or vias formed therein, a number of connector pins, with each pin soldered into one of the through holes with high melt temperature solder is disclosed in one embodiment. A damming device or protrusion may be located on the pin nearer to the shoulder than typical interference fit protrusions, the damming device sized and shaped to substantially completely block the through hole or via.

DESCRIPTION OF EMBODIMENTS

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
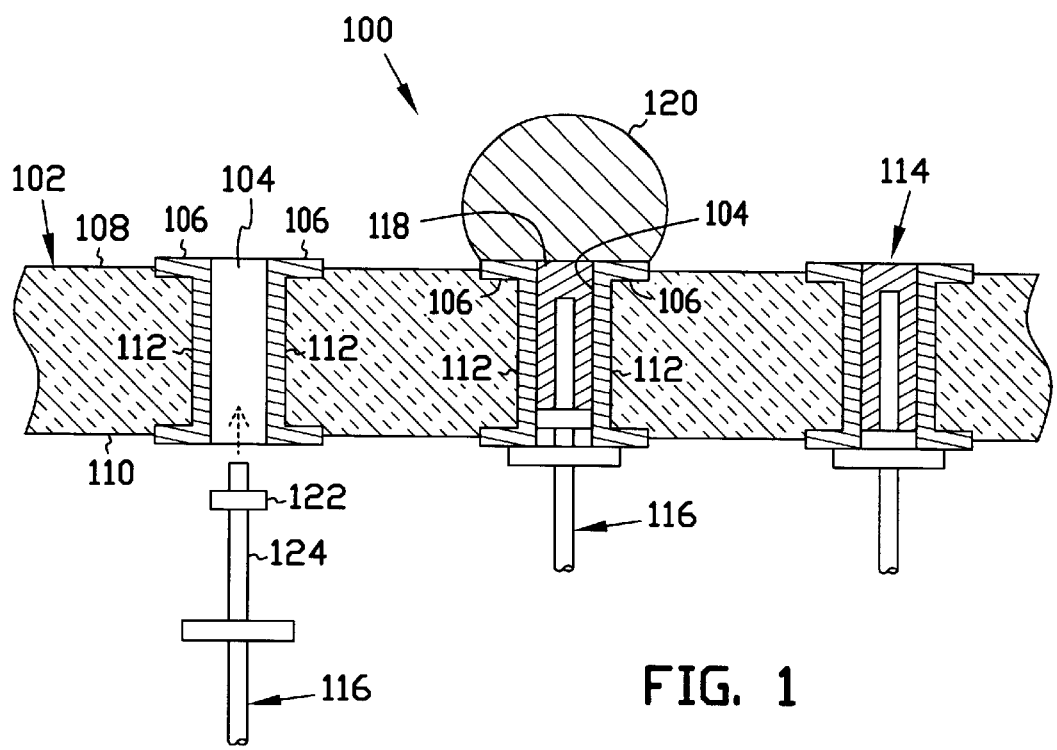
FIG. 1 is a side sectional view of an apparatus embodiment of the invention.

Referring now to the drawings, FIG. 1 shows a surface mountable pin connector 100 comprising a substrate or circuit board carrier 102 having a plurality of through holes or vias 104 therein. Through holes or vias 104 are plated or metalized with a layer of metal 106 on the top side 108 and bottom side 110 of the carrier 102, and the walls 112 of the holes or vias 104, forming a plurality of metalized lands 114. Within this specification and claims, top and bottom are relative terms used to assist in describing the drawings, and should not be construed to indicate a required orientation.

Circuit board carrier 102 may be produced using conventional printed circuit board (PCB) fabrication techniques and processes, and is generally made of FR4 laminate material using copper conductor metalization. It should be understood, however, that other printed circuit carrier materials and metalization may be substituted without deviating from the scope of the invention. Such alternative PCB materials and metalization material are well known in the art and will not be described further herein. Carrier 102 could also be a multilayer PCB which would allow for routing of signal connections between pin locations or through holes 104, or for the possibility of power/ground planes which could be used to distribute current among many pins.

A plurality of metal pins 116 are placed into the holes 104, and soldered into place with a high melt temperature solder 118. The initial soldering of the pins 116 into the through holes or vias 104 prevents the pins 116 from falling out of the circuit board carrier 102 during later process formation of the connector 100. The initial soldering of pins 116 into the through holes or vias 104 also tends to fill any variable size voids or air gaps present within the holes 104. Such voids or air gaps may adversely affect the later formation of other parts of the connector 100, since inconsistencies and non-uniformities in the solder fill of the holes 104 may lead to non-coplanarity problems.

Solder such as solder 118 in a via or through hole 104 which is heated later to a temperature at which it melts will wick around a pin such as pin 116 during reflow. Such wicking creates a number of potential problems, including weakening of the mechanical joint between the pins 116 and the carrier 102, as well as wicking of solder 118 by capillary action over the surface of the pin 116.

Figure 2:
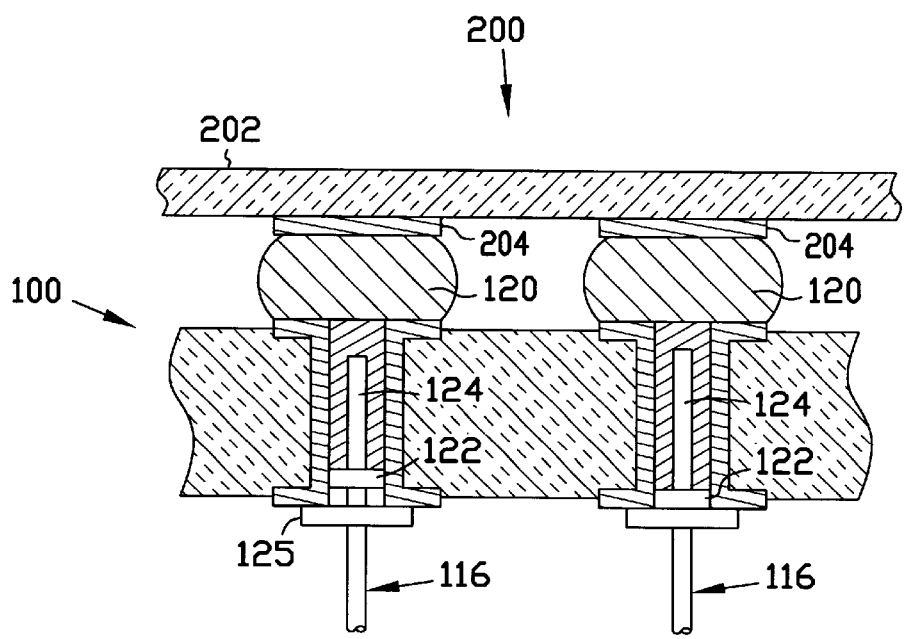
FIG. 2 is a side sectional view showing the apparatus embodiment of FIG. 1 connected to a surface mount assembly.

After the pins 116 are attached to the carrier 102 using solder 118, an array of solder balls 120 is placed on the lands 114, and reflowed onto the lands 114 on the top 108 of the circuit carrier 102, opposite the bottom 110, from which pins 116 extend. Solder balls 120 preferably comprise a solder having a lower melting point than solder 118, so that during reflow to attach the solder balls 120 to the lands 114, high melt temperature solder 118 does not melt, and no wicking of solder 118 occurs. Solder 118 in the holes or vias 104 does not melt during reflow. The attachment of solder balls 120 on connector 100 provides a larger quantity of solder for attachment of the connector 100 to the next level assembly 202 (FIG. 2). This larger solder volume improves the mechanical joint between the pins 116 and the carrier 102 as well as between the connector and the next level assembly 202.

A connector 100 mounted to a standard surface mount assembly 202 is shown as numeral 200 in FIG. 2. FIG. 2 shows a section of a completed connector 100 connected to surface mount assembly 202. Surface mount assembly 202 has a metalized land pattern of lands 204 which matches the array of solder balls 120 on connector 100. Conventional solder paste or flux can be printed on the surface mount assembly 202 land pattern to facilitate attachment of the connector 100 to the surface mount assembly 202. Connector solder balls 120 are reflowed again to connect the connector 100 to the surface mount assembly 202.

Pins 116 are preferably press fit into the holes or vias 104. Shoulder 125 of pins 116 abuts the plated through holes 104 to control the depth to which pins 116 extend into holes or vias 104. In another embodiment, pins 116 have a damming protrusion 122 extending radially from the pin body 124. Protrusion 122 is shaped to closely fit the geometry of the holes or vias 104. For example, for substantially round holes or vias 104, the diameter of the protrusion 122 is closely matched in size to the diameter of the holes or vias, allowing a damming fit of the protrusion 122 in the holes or vias 104. For a non-round hole or via 104, the cross sectional shape of protrusion 122 is such that it is closely conformed to the cross sectional shape and size of the holes or vias 104 after formation of the metalization layer 106. The protrusion 122 then forms a type of friction fit with the metalization layer 106, tightly fitting in the via or hole 104 to substantially completely block the hole or via 104 in cross section.

Protrusion 122 is a physical damming device which assists in the physical reduction of solder wicking in the holes or vias 104. Damming protrusion 122 is preferably located near shoulder 125 of pins 116, to maximize the amount of solder 118 holding pins 116 within through holes or vias 104. The figures show protrusion 122 spaced slightly apart from shoulder 125, and abutting shoulder 125. It should be understood that the location of protrusion 122 may be varied without departing from the scope of the invention, and that other placements of damming protrusion would still substantially eliminate wicking of hole solder 118 over the surface and shoulder of pins 116. Such alternate placements of damming protrusion 122 are best shown in FIGS. 1–4.

Physical damming protrusion 122 on pins 116, which substantially blocks holes or vias 104, may allow a lower melt temperature solder 118 to be used in holes or vias 104 for initially securing pins 116 within holes or vias 104. The damming protrusion's physical blocking of the vias or holes 104 would reduce wicking due to melted solder 118. If wicking were reduced, the amount of depletion of the solder 118 in holes or vias 104 could be reduced enough to allow lower melt temperature solder 118 for the holding solder. However, preferably, the melt temperature of the holding solder 118 would be at or above the melt temperature of the solder balls 120 or 306.

Solder 118 should be interpreted within the specification and claims as a eutectic type alloy melting above a certain temperature. It should be understood that any eutectic alloy having a sufficiently high melting point will be suitable for the purpose of mechanically attaching the pins 116 to the circuit carrier through holes or vias 104.

Figure 3:
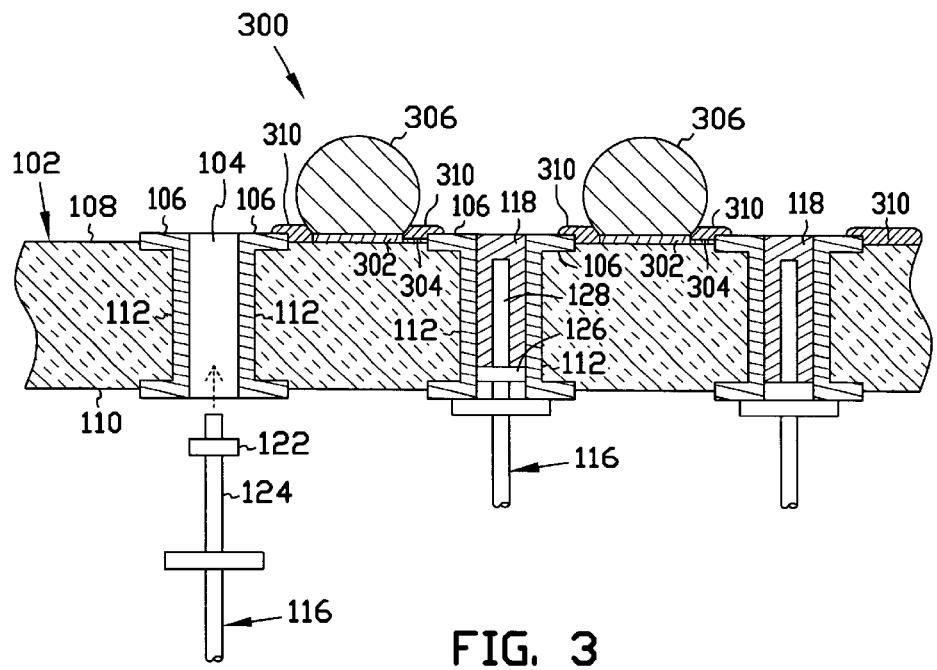
FIG. 3 is a side sectional view of another apparatus embodiment of the invention.

Referring now to FIG. 3, another embodiment 300 of a surface mountable pin connector is shown. Surface mountable pin connector 300 is similar in configuration to surface mountable pin connector 100. However, in embodiment 300, solder balls are not placed directly over the pin locations, as solder balls 120 are placed in embodiment 100. In surface mountable pin connector 300, lands 302 are formed on the carrier 102 offset from the pin locations in holes or vias 104. Metalized traces 304 are formed on the carrier 102 to connect lands 302 to the vias or holes 104 containing pins 116. Solder mask 310 can be used to prevent solder from flowing onto the vias or holes 104 and to help define and contain the solder balls 306. An array of solder balls 306 is placed on the lands 302, and reflowed onto the lands 302 in similar fashion as was described with reference to FIG. 1.

The assembly process by which connectors are to be attached to surface mount assemblies or the like can be very sensitive to minor fluctuations or deviations in solder ball profile and height. When solder balls such as solder balls 120 are 20 placed directly over the pin locations, the potentially varied topology of the pin holes or vias 104 could lead to increased ball size and shape variation, and variations in height of the solder balls 120. When lands 302 are formed on the carrier surface, the topology is more likely to be flat. Better ball coplanarity may be achieved by placing lands 302 on the substrate surface, and connecting the lands 302 to vias 104 by metalized traces 304.

Figure 4:
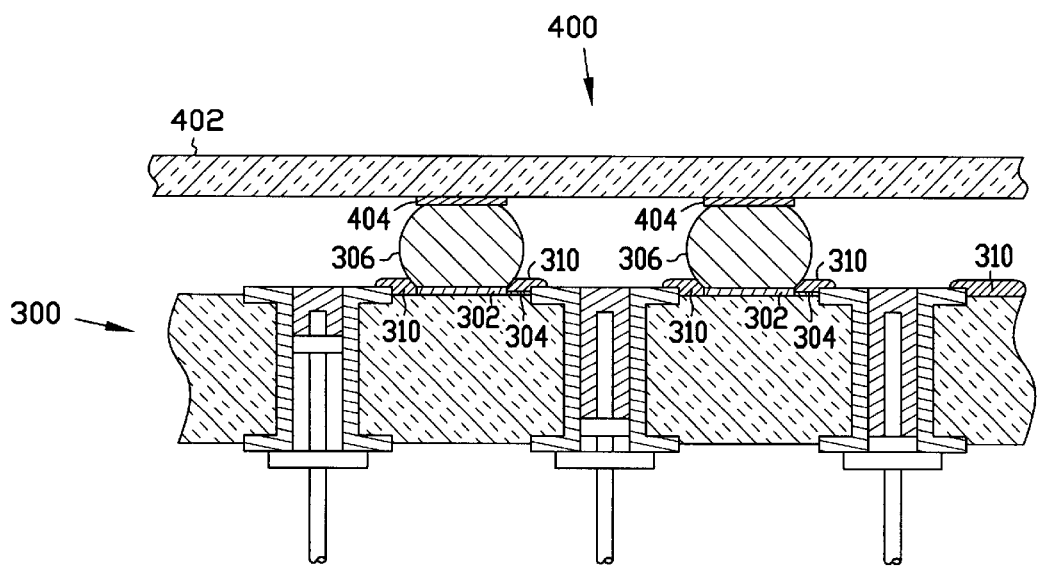
FIG. 4 is a side elevation view showing the apparatus embodiment of FIG. 3 connected to a surface mount assembly.

A connector 300 mounted to a standard surface mount assembly 402 is shown as numeral 400 in FIG. 4. FIG. 4 shows a section of a completed connector 300 connected to surface mount assembly 402. Surface mount assembly 402 has a metalized land pattern of lands 404 which matches the array of solder balls 306 on connector 300. Conventional solder paste or flux can be printed on the surface mount assembly 402 land pattern to facilitate attachment of the connector 300 to the surface mount assembly 402. Connector solder balls 306 are reflowed again to connect the connector 300 to the surface mount assembly 402.

Reflowing to solder of the connectors 100 or 300 with solder balls 120 and 306, respectively, allows the connector to be more tolerant to misregistration and placement inaccuracy due to a tendency of the larger solder balls to facilitate self centering of the connector during surface mount assembly. This occurs due to surface tension forces of the molten solder of solder balls 120 or 306 between the connector and the substrate lands.

Once a connector such as connectors 100 and 300 are formed, mounting the connector to a surface mount assembly is accomplished using standard surface mount techniques. This means that no new surface mount technology will be required to be used, and that manufacturers such as OEMs will not need to change surface mount technologies in order to use the apparatus embodiments of the invention.

Figure 5:
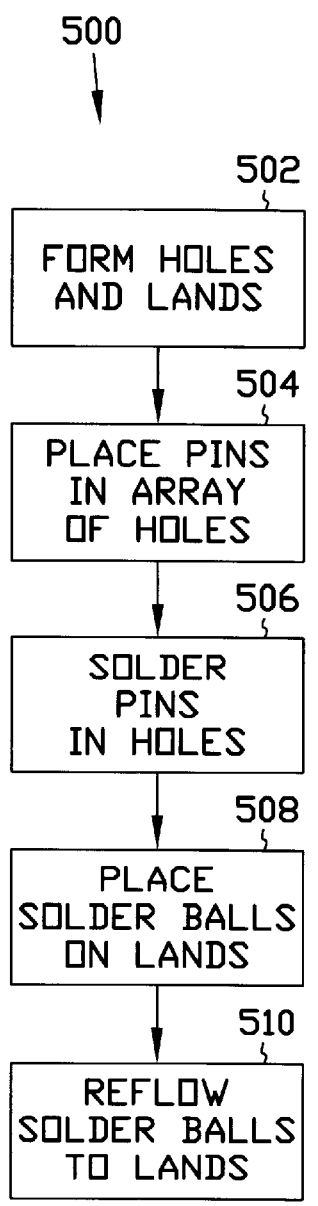
FIG. 5 is a block flow chart diagram of a method embodiment of the invention.

Referring now also to FIG. 5, a process flow chart diagram of a method 500 for forming a surface mount connector is shown. Method 500 comprises forming a plurality of vias and metalized lands on a circuit board carrier in block 502, placing a plurality of metal pins into the array of vias or through holes in the circuit board carrier in block 504, soldering the pins into the circuit board carrier in block 506, placing an array of solder balls, one solder ball for each land, on the lands, in block 508, and reflowing the solder balls to connect the solder balls to the lands in block 510.

In soldering the pins to the circuit board carrier in block 506, a high melt temperature solder is used. The high melt temperature solder is used to create a high melt temperature mechanical connection between the pins and the vias or through holes of the circuit board carrier. In the method 500, soldering of the pins into the through holes of the circuit board carrier as in block 506 is presently accomplished at a minimum of 183 degrees Centigrade. Preferably, the soldering is accomplished at a soldering temperature of at least 230 degrees Centigrade, and in one embodiment, preferably at 240 degrees Centigrade.

In block 510, reflowing of the solder balls to connect the solder balls to the lands is accomplished at a solder temperature less than the high melt temperature soldering. This is done to assure that the high melt temperature solder connecting the pins to the circuit board carrier vias or through holes does not melt, which would break or mechanically weaken the connection of the pins to the circuit board carrier.

In forming the metalized lands as in block 502, the lands may be formed directly over the through holes containing the pins. Alternatively, the metalized lands may be formed offset from the through holes and pins, on the circuit board carrier, connected to the vias or through holes by metalized traces.

Figure 6:
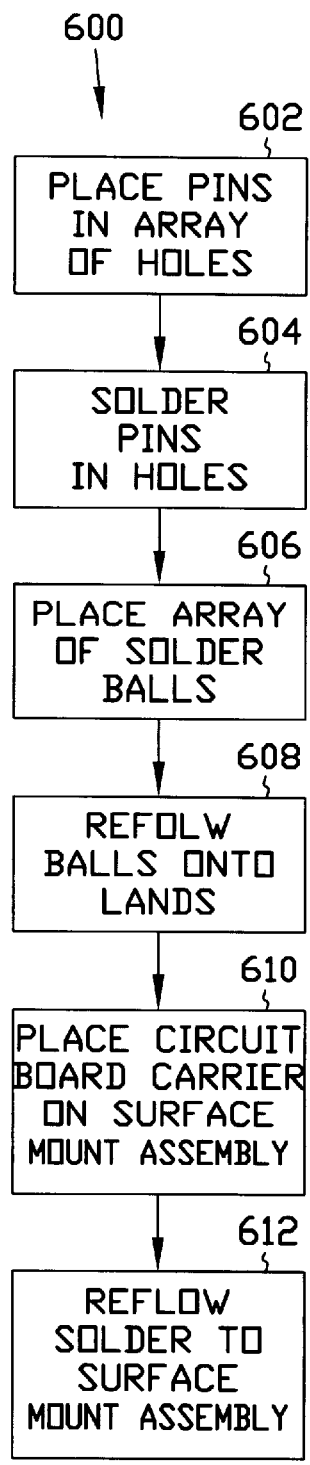
FIG. 6 is a block flow chart diagram of another method embodiment of the invention.

Referring now to FIG. 6, a process flow chart diagram of a method embodiment 600 for connecting a connector to a surface mount assembly is shown. Method 600 comprises placing a plurality of pins in an array of holes or vias in a substrate in block 602, soldering the pins into the holes or vias in block 604, placing an array of solder balls on lands formed on the substrate in block 606, reflowing the solder balls to the lands in block 608, placing the substrate on a standard surface mount assembly in block 610, and reflowing the solder balls to connect the connector to the surface mount assembly in block 612. A high melt temperature solder as described above may also be used to solder the pins into the holes or vias of the substrate in method embodiment 600.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A circuit interconnect, comprising:
a circuit board carrier having a plurality of plated through holes formed therein;
a plurality of pins, each pin being soldered into a respective one of the plurality of plated through holes;
a plurality of lands located over the through holes; and
a plurality of solder balls attached to the lands.

2. A circuit interconnect as described in claim 1, wherein each of the plurality of pins has a damming protrusion extending radially therefrom, the damming protrusion having a diameter closely matching the diameter of the plated through holes, the damming protrusion substantially completely damming the through hole.

3. A circuit interconnect as described in claim 1, wherein each of the plurality of pins has damming protrusion extending therefrom, the damming protrusion substantially completely blocking the through hole.

4. A circuit interconnect as described in claim 1, wherein the solder in the plurality of plated through holes is high melt temperature solder.

5. A circuit interconnect as described in claim 4, wherein the high melt temperature solder has a melting point of at least 183 degrees Centigrade.

6. A circuit interconnect as described in claim 4, wherein the high melt temperature solder has a melting point of at least 230 degrees Centigrade.

7. A circuit interconnect as described in claim 3, wherein each pin has a shoulder extending therefrom, the shoulder defining the extent of penetration of the pin into one of the through holes, and wherein the damming protrusion abuts the shoulder.

8. A circuit interconnect as described in claim 1, wherein the solder balls and the solder in the plurality of through holes have different melt temperatures.

9. A circuit interconnect as described in claim 8, wherein the solder ball melt temperature is lower than the melt temperature of the solder in the plurality of through holes.

10. A circuit interconnect, comprising:
a circuit board carrier having a plurality of plated through holes formed therein;
a plurality of pins, each pin being soldered into a respective one of the plurality of plated through holes;
a plurality of lands offset from the through holes;
a metalized trace connecting each land to a plated through hole; and
a plurality of solder balls attached to the lands.

11. The circuit interconnect as described in claim 10, and further comprising:
a solder mask to prevent solder from flowing onto the vias.

12. A circuit interconnect as described in claim 10, wherein each of the plurality of pins has a damming protrusion extending therefrom, the damming protrusion substantially completely blocking the through hole.

13. A circuit interconnect as described on claim 10, wherein the solder in the plurality of through holes is high melt temperature solder.

14. A circuit interconnect as described in claim 13, wherein the high melt temperature solder has a melting point of at least 183 degrees Centigrade.

15. A circuit interconnect as described in claim 13, wherein the high melt temperature solder has a melting point of at least 230 degrees Centigrade.

16. A circuit interconnect as described in claim 10, wherein each of the plurality of pins is press fitted into one of the through holes.

17. A circuit interconnect as described in claim 10, wherein the solder balls have a melting point lower than the melting point of the high melt temperature solder.

* * * * *